United States Patent

Franke

Patent Number: 5,585,746
Date of Patent: Dec. 17, 1996

[54] CURRENT SENSING CIRCUIT

[75] Inventor: Ralph J. Franke, Glendale, Ariz.

[73] Assignee: Honeywell Inc., Minneapolis, Minn.

[21] Appl. No.: 535,492

[22] Filed: Sep. 28, 1995

[51] Int. Cl.$^6$ .................................................. G01R 19/00
[52] U.S. Cl. ............................... 327/54; 327/51; 327/52; 327/103
[58] Field of Search ......................... 327/50, 51, 54, 327/73, 103, 365, 433, 540, 52

[56] References Cited

U.S. PATENT DOCUMENTS

| | | | |
|---|---|---|---|
| 4,991,141 | 2/1991 | Tran | 327/54 |
| 5,101,126 | 3/1992 | Butler et al. | 327/103 |
| 5,331,225 | 7/1994 | Matsui et al. | 327/433 |
| 5,498,984 | 3/1996 | Schaffer | 327/51 |

Primary Examiner—Timothy P. Callahan
Assistant Examiner—Jung Ho Kim
Attorney, Agent, or Firm—Robert A. Pajak; Charles J. Ungemach

[57] ABSTRACT

A current sensing circuit is described in which a pair of bipolar transistors are arranged with a pair of field effect transistors such that the field effect transistors absorb most of the supply voltage associated with a load.

6 Claims, 1 Drawing Sheet

1

CURRENT SENSING CIRCUIT

The invention described herein was made in the performance of work under a NASA contract and is subject to provisions of the National Aeronautics and Space Act of 1958, Public Law 85568 (172 Stat, 435; 42 U.S.C. 2457), as amended.

BACKGROUND OF THE INVENTION

1. Field of the Invention

This invention relates generally to current sensing circuits in which current flowing through a conductor is measured, and more specifically, those current sensing circuits which employ a small sensing resistor in series with the conductor.

2. Description of the Related Art

Current sensing circuits commonly found in the art employ a sensing resistor, generally a very small value resistor, in series with a conductor, and current flow is determined by observing the voltage drop across the sensing resistor. The sensing resistor is generally kept as small as possible to avoid wasted power, yet large enough to provide an adequate signal voltage level. However, replicating this signal at ground potential can be difficult to arrange.

A common practice has been the employment of a balanced bridge voltage divider to accomplish translation from the voltage across the sensing resistor to an output voltage which is proportional to the current flowing through the sensing resistor. However, as the supply voltage becomes greater, the fraction of the voltage across the sensing resistor available at ground reference becomes smaller. If the resistors in the balance bridge start at precisely the proper values and track each other every closely over both time and temperature, amplification may then be used to recover the signal voltage.

However, any imbalance in the bridge shows up as an offset voltage which may introduce errors in the output signal. This, of course, is a very serious problem if the offset voltage is an appreciable fraction of the desired signal. Because the offset voltage is of unknown sign, it may make the output signal voltage appear either larger or smaller than the intended value.

SUMMARY OF THE INVENTION

In the present invention, a pair of bipolar transistors are symmetrically arranged with a pair of field effect transistors. A sensing resistor is electrically connected between the base terminating regions of the bipolar transistor pair. Each of the collector currents is intended to pass throughout a field effect transistor and a measurement resistor. The voltage drop difference across the measurement resistors is amplified by a negative feedback amplifier to provide an output voltage proportional to current flowing through the sensing resistor.

DESCRIPTION OF THE PREFERRED EMBODIMENT

Figure 1:
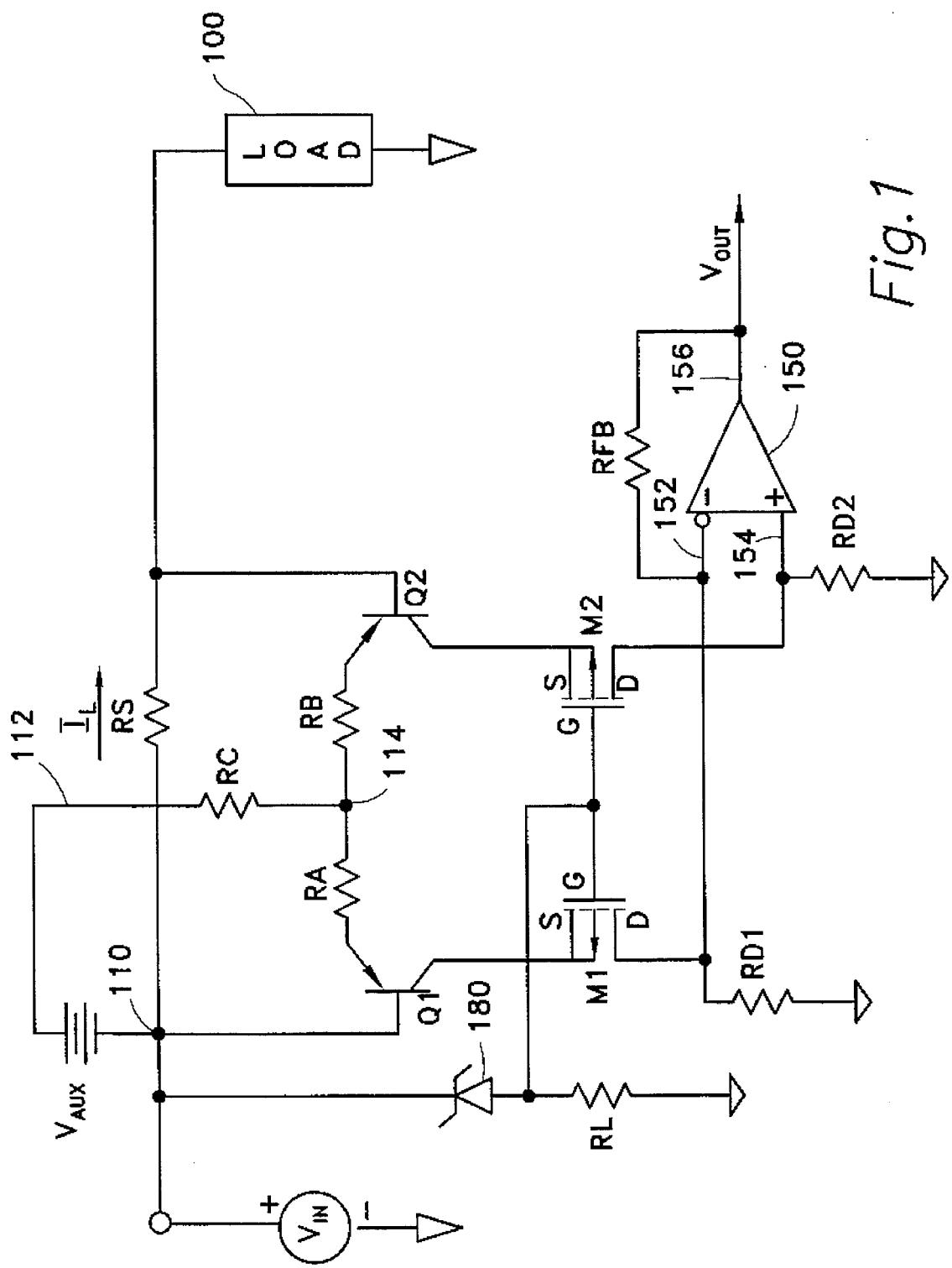
FIG. 1 is a schematic circuit diagram illustrating the current sensing circuit in accordance with the present invention.

Illustrated in FIG. 1 is a schematic drawing of the current sensing circuit in accordance with the present invention. Thereshown is a supply voltage $V_{IN}$ providing current to the series combination of the sensing resistor RS and the load numerically identified as 100. As illustrated, one side of load 100 is connected to a reference potential, indicated as ground in the drawing, and the other side is connected to the sensing resistor RS.

A differential amplifying circuit comprised of transistors Q1 and Q2, RA, RB, and RC, and an auxiliary supply voltage $V_{AUX}$ further illustrated. The transistors are illustrated as PNP bipolar transistors, with the sensing resistor RS connected between the base of transistor Q1 and the base of transistor Q2. The negative side of supply voltage $V_{AUX}$ is connected to terminating junction 110. Resistor RC is connected between the positive side of supply voltage $V_{AUX}$ and terminating junction 114. Resistor RA is connected between terminating junction 114 and the emitter of transistor Q1. Resistor RB is connected between the emitter of transistor Q2 and terminating junction 114.

Further shown is a pair of field effect transistors, more specifically, P channel MOSFET transistors M1 and M2 having their gate terminating regions electrically connected in common. The source of transistor M1 is electrically connected to the collector of transistor Q1, and the source of transistor M2 is connected to the collector of transistor Q2. A measurement resistor RD1 is electrically connected between the reference potential and the drain of transistor M1, and measurement resistor RD2 is electrically connected between the reference potential and the drain of transistor M2.

A negative feedback amplifier 150 is shown having a negative input means 152, a positive input means 154, and an output means 156. A feedback resistor RFB is electrically connected between negative input means 152 and output means 156. Further, the negative input means 152 is electrically connected to the drain of transistor M1, and the positive input means 154 is electrically connected to the drain of transistor M2.

Bipolar transistors Q1 and Q2 are intended to be a very closely matched pair of transistors. Furthermore, resistors RA and RB are intended to be substantially identical and also very closely matched with regard to their temperature coefficients and stability. Similarly, measurement resistors RD1 and RD2 are intended to be closely matched and identical resistors.

Furthershown in FIG. 1 is a bias supply circuit for biasing the gate regions of transistor M1 and M2. The bias supply voltage is comprised of zener diode 180 and current limiting resistor RL. The zener diode 180 is electrically connected between the gate regions of transistors M1 and M2 and terminating junction 110. Current limiting resistor RL is electrically connected between the gate regions of transistors M1 and M2, and the ground reference potential.

The operation of the current sensing circuit illustrated in FIG 1 is such that the output voltage $V_{out}$ is proportional to the load current $I_L$ passing through the sensing resistor RS. The current sensing circuit of FIG. 1 achieves the intended output voltage by the novel arrangement of the bipolar pair of transistors Q1 and Q2, and the field effect transistors M1 and M2.

In operation, the series combination of zener diode 180 and resistor RL biases the gates of transistors M1 and M2 with a voltage which floats in proportion to the input voltage $V_{IN}$. However, field effect transistors M1 and M2, more particularly MOSFET transistors, draw substantially no gate currents. Therefore, substantially no component of the drain currents of transistor M1 and M2 is due to the gate of biasing voltage circuit.

As should be understood by those skilled in the art, the state of the bipolar pair of transistors Q1 and Q2, when there is no load current, is such that the emitter currents of transistors Q1 and Q2, i.e., flowing through resistors RA and RB, respectively, are substantially equal. In this case, each of the source currents of transistors M1 and M2 is substantially equal to their corresponding collector current, namely the collector current of transistors Q1 and Q2, respectively. Therefore, the input voltage to operational amplifier 150 is substantially zero, and the output voltage VL is also substantially zero. This is no since the voltage drop across resistor RD1 is substantially equal to the voltage drop across resistor RD2.

However, as the load current, $I_L$ increases, the emitter current, and corresponding collector, of transistor Q2 increases since the voltage drop across the sensing resistor forward biases transistor Q2, and at the same time results in the emitter current of Q1 decreasing resulting in the collector current of transistor Q1 decreasing. Since source and drain currents of transistors M1 and M2 are substantially the same as the corresponding collector currents of transistors Q1 and Q2, respectively, the voltage drop across resistor RD2 increases relative to the voltage drop across resistor RD1. This results in an increase in the output voltage observed by the negative feedback amplifier, and results in an increase in output voltage at output means 156, thereof. Thus, the behavior of the operational amplifier 150 in this situation results in the output voltage to increase in proportion to the load current flowing through sensing resistor RS.

As should be well understood by those skilled in the art of differential amplifier circuits, resistor RC serves as a biasing resistor for establishing the operating collector currents of bipolar transistors Q1 and Q2. In accordance with the present invention, it should be noted that the drain currents passing through resistors RD1 and RD2, and corresponding drains of transistors M1 and M2, respectively, are substantially independent of the input supply voltage $V_{IN}$.

As indicated earlier, closely matched transistor pair Q1 and Q2 is a key to proper operation, and must be very close over time and temperature. However, most differential amplifier circuits are such that matching of transistors Q1 and Q2 are not as common for a high supply voltage $V_{IN}$. However, in practice of the present invention with employment of the two field effect transistors M1 and M2, the operating voltage served by the bipolar transistors Q1 and Q2 is much reduced, since the two field effect transistor, M1 and M2, stand off most of the supply voltage $V_{IN}$. That is, most of the supply voltage $V_{IN}$ is between the source and drain terminating regions of the field transistors, and the remaining components of the supply voltage across the emitter and collector junctions of the bipolar transistors are much reduced.

The embodiments of an invention in which an exclusive property or right is claimed are defined as follows:

1. A current sensing circuit for providing an output signal proportional to current passing through a conductor provided by a supply voltage, the current sensing circuit comprising:

first and second bipolar transistors, each having a base terminating region, a collector terminating region, and an emitter terminating region;

a sensing impedance in series with said conductor, and electrically connected between said base terminating region of said first bipolar transistor and said base terminating region of said second bipolar transistor;

first and second field effect transistors, each having a gate terminating region, a source terminating region, and a drain terminating region, said source terminating region of said first field effect transistor electrically connected to said collector terminating region of said first bipolar transistor, and said source terminating region of said second field effect transistor electrically connected to said collector terminating region of said second bipolar transistor, said gate terminating regions of said first and second field effect transistors electrically connected in common;

bias voltage means, coupled to said supply voltage, for providing a bias voltage at a bias output means thereof which varies substantially in proportion to said supply voltage, and where said bias output means is electrically connected to said common gate regions of said first and second field effect transistors; and a negative feedback amplifier means having a positive input means and a negative input means, and an output means, said negative feedback amplifier including a selected impedance electrically connected between said negative input means and said output means, said negative input means electrically connected to said drain terminating region of said first field effect transistor, and said positive input means electrically connected to said drain terminating region of said second field effect transistor.

2. The current sensing circuit of claim 1 further comprising:

a first impedance electrically connected between a first reference potential and said positive input means and;

a second impedance electrically connected between said first reference potential and said negative input means.

3. The current sensing circuit of claim 1 wherein said first and second bipolar transistors are PNP type transistors, and said first and second field effect transistors are P-channel MOSFET transistors.

4. The current sensing circuit of claim 1 wherein:

said supply voltage is provided by a supply voltage means which includes a first polarity terminating means, and a second polarity terminating means, and said bias voltage means includes a series combination of a zener diode voltage regulator and a limit resistor, said zener diode voltage regulator having first and second zener terminating regions, where said first zener terminating region is electrically connected in common with said limit resistor and said bias output means, and said second zener terminating region is electrically connected to one of said first and second polarity terminating means of said supply voltage.

5. The current sensing circuit of claim 4 wherein said first polarity terminating means of said supply voltage is electrically connected to said base terminating region of said first transistor.

6. The current sensing circuit of claim 5 further comprising:

a first emitter resistor having a first side thereof electrically connected to said emitter terminating region of said first transistor, a second emitter resistor having a first side thereof electrically connected to said emitter terminating region of said second transistor, a bias limit resistor having a first side thereof electrically connected in common to a second side of each of said first and second emitter resistors; and a reference supply voltage means having first and second polarity terminating means, first polarity terminating means thereof electrically connected to said second side of said bias limit resistor, and second polarity terminating means thereof electrically connected to one of said first and second polarity terminating means of said supply voltage.

\* \* \* \* \*